United States Patent [19]
Hashimoto

[11] Patent Number: 5,513,193
[45] Date of Patent: Apr. 30, 1996

[54] NON-VOLATILE SEMICONDUCTOR MEMORY DEVICE CAPABLE OF CHECKING THE THRESHOLD VALUE OF MEMORY CELLS

[75] Inventor: Kiyokazu Hashimoto, Tokyo, Japan

[73] Assignee: NEC Corporation, Tokyo, Japan

[21] Appl. No.: 467,349

[22] Filed: Jun. 6, 1995

Related U.S. Application Data

[63] Continuation of Ser. No. 995,821, Dec. 23, 1992, abandoned.

[30] Foreign Application Priority Data

Dec. 27, 1991 [JP] Japan ................ 3-359813

[51] Int. Cl.$^6$ .................................... G11C 29/00
[52] U.S. Cl. ........................ 371/67.1; 365/201
[58] Field of Search ................ 365/200, 201; 371/67.1, 28, 21.1, 21.2, 21.3, 21.4, 21.5

[56] References Cited

U.S. PATENT DOCUMENTS

| | | | |
|---|---|---|---|
| 4,460,982 | 7/1984 | Gee et al. | 371/21.4 |
| 4,809,231 | 2/1989 | Shannon et al. | 371/21.4 |
| 4,841,482 | 6/1989 | Kreifels et al. | 365/185 |
| 4,862,459 | 8/1989 | Fukushima | 371/21.4 |
| 5,052,002 | 9/1991 | Tanagawa | 371/21.4 |
| 5,142,495 | 8/1992 | Canepa | 371/21.4 |
| 5,220,533 | 6/1993 | Turner | 365/218 |
| 5,268,870 | 12/1993 | Harari | 371/21.4 |

FOREIGN PATENT DOCUMENTS

| | | | |
|---|---|---|---|
| 0413347 | 2/1991 | European Pat. Off. | G11C 16/06 |
| 2215155 | 9/1989 | United Kingdom | G11C 17/00 |

OTHER PUBLICATIONS

IEEE Journal of Solid–State Circuits, vol. 25, No. 5, Oct. 1990, pp. 1147–1151, Seki et al., "An 80 ns 1 Mb Flash Memory with on Chip Erase/Erase–Verify Controller".

San et al "A New Technique for Determining the Capacitive Capling Coefficients in Flash EPROM's," IEEE Elec. Device letters vol. 13 No. 6 Jun. 1992.

Mehrotra et al "Serial 9Mb Flash EEPROM for Solid State Disk Applications" 1992 Symp. on VLSI Circuits Digest Tech. Papers.

V. Kynett et al., "A 90-ns One-Million Erase/Programe Cycle 1-Mbit Flash Memory", IEEE Journal of Solid–State Circuits, vol. 24, No. 5, Oct. 1989, pp. 1259–1263.

*Primary Examiner*—Robert W. Beausoliel, Jr.
*Assistant Examiner*—Joseph E. Palys
*Attorney, Agent, or Firm*—Sughrue, Mion, Zinn, Macpeak & Seas

[57] ABSTRACT

In collectively and electrically erasing a plurality of memory cells, to set the threshold values of the memory cells constant, electrons are previously stored in the floating gates of the memory cells. The memory cells whose floating gates are accumulated with electrons are electrically erased and the threshold value of each erased memory cell is checked. The collective erasing of the memory cells is repeated until the threshold values of all the memory cells become equal to or below a first value. When it is detected that the threshold values of the memory cells become equal to or below the first value, it is discriminated if those threshold values are equal to or above a second value smaller than the first value. When there is a memory cell whose threshold value is equal to or below a minimum value allowable based on the design, in the previous discrimination step, that memory cell is over-erased and the memory chip containing the memory cell is determined as a defect.

18 Claims, 10 Drawing Sheets

NON-VOLATILE SEMICONDUCTOR MEMORY DEVICE CAPABLE OF CHECKING THE THRESHOLD VALUE OF MEMORY CELLS

This is a continuation of application Ser. No. 07/995,821 filed Dec. 23, 1992, now abandoned.

BACKGROUND OF THE INVENTION

Field of the Invention

The present invention relates to a non-volatile semiconductor memory device essentially comprising MOSFET's, and, more particularly, to an electrically erasable and programmable non-volatile semiconductor memory device (hereinafter called "EEPROM").

Description of the Related Art

FIG. 1 shows an example of the structure of a conventional collectively-erasable EEPROM (hereinafter referred to as "flash EEPROM".

Referring to FIG. 1, a memory cell block MX has memory cells ($M_{11}, \ldots, M_{1m}, \ldots M_{l1}, \ldots$, and $M_{lm}$) arranged in a matrix. A Y selector group YS comprises switches each of which connects a selected one of digit lines ($D_1, \ldots$, and $D_l$) to a sense amplifier SA and a write circuit WC. Those switches respectively consist of N-channel, enhancement type MOSFET's (NE-MOSFET's) $Q_{Y1}$ to $Q_{Yl}$ that are connected between a node SB and the associated digit lines $D_1$ to $D_l$.

Y address lines $Y_1$ to $Y_l$ are connected to output terminals of a Y decoder (referred to as "Y-DEC" (not shown)) to specify the Y addresses of the memory cells.

X address lines $W_1$ to $W_m$ are connected to output terminals of an X decoder (referred to as "X-DEC" (not shown)) to specify the X addresses of the memory cells.

The sources of the memory cells $M_{11}, \ldots, M_{1m}, \ldots, M_{l1}, \ldots$, and $M_{lm}$ are commonly connected to a node SS. Also connected to the node SS is an output terminal of an erase control circuit ERC.

The write circuit WC electrically writes data in a selected memory cell, while the sense amplifier SA amplifies data stored in the selected memory cell. An input/output (I/O) buffer I/OB sends write data, supplied from an input/output (I/O) terminal I/OT, to the write circuit WC in write mode, and outputs data, supplied from the sense amplifier SA, to the I/O terminal I/OT.

It is known that an actual flash EEPROM includes multiple circuits of the type shown in FIG. 1 (for example, 16 circuits for a 16-bit parallel input/output). For diagram's sake, however, FIG. 1 shows only one of the circuits.

In the following description, it is defined that a memory cell, which has been electrically erased or has no electrons injected in its floating gate, is storing "1" and the threshold value of such a memory cell is expressed as $V_{TM}(E)$, and that a memory cell, which has been electrically programmed or has electrons injected in its floating gate, is storing "0" and the threshold value of such a memory cell is expressed as $V_{TM}(W)$. Further, the threshold values of NE-MOSFET's are the same and are expressed as $V_{TN}$.

Referring now to FIG. 2 and Table 1 below, a description will be given of the operations of a flash EEPROM in individual modes in the case where the memory cell $M_{11}$ is selected by the address signal.

Table 1 gives voltages applied to the main nodes and the signal lines in individual modes.

TABLE 1

| Signal line or node<br>Mode | $W_1$ | $Y_1$ | $D_1$ | SS | VW | B(W+V) |
|---|---|---|---|---|---|---|
| Write (P) | $V_{PP}$ | $V_{PP}$ | $V_{PP}-V_{TN}$ or 0 | 0 | $V_{PP}$ | 0 |
| Erase (E) | 0 | 0 | open | $V_{PP}$ | $V_{PP}$ | 0 |
| Read (R) | $V_{CC}$ | $V_{CC}$ | 1.5 V | 0 | $V_{CC}$ | $V_{CC}$ |
| Write Verify (PV) | $V_{PV}$ | $V_{CC}$ | 1.5 V | 0 | $V_{PV}$ | 0 |
| Erase Verify (EV) | $V_{EV}$ | $V_{CC}$ | 1.5 V | 0 | $V_{EV}$ | 0 |

$W_1$: selected X address line,
$Y_1$: selected Y address line,
$D_1$: selected digit line,
SS: common source of memory cells,
VW, B(W+V): signal line shown in FIG. 2.

(1) Write Mode

This mode is to write data "0" into a memory cell (or to charge the floating gate with electrons).

A high voltage $V_{PP}$ is applied to the selected X address line $W_1$ and 0 V to the non-selected X address lines $W_2-W_m$, while $V_{PP}$ is applied to the selected Y address line $Y_1$ and 0 V to the non-selected Y address lines $Y_2-Y_l$. The common source SS is applied with 0 V. When data "0" is supplied to the I/O terminal I/OT, the write circuit WC becomes active so that a high voltage $V_{PP}$ appears at the output terminal. Consequently, a high voltage ($V_{PP}-V_{TN}$) is applied to the selected digit line $D_1$, injecting electrons into the floating gate of the memory cell $M_{11}$. This raises the threshold value of the memory cell $M_{11}$ to $V_{TM}(W)$. The threshold value $V_{TM}(W)$ is generally designed higher than the power supply voltage $V_{cc}$.

When data "1" is supplied to the I/O terminal I/OT, on the other hand, the write circuit WC becomes inactive so that the selected digit line $D_1$ is discharged via the memory cell $M_{11}$ to have 0 V. Accordingly, no electrons will be injected to the floating gate of the memory cell $M_{11}$.

(2) Erase Mode

This mode is to electrically erase a memory cell (or to discharge the electrons accumulated into the floating gate).

This mode includes a block erase mode to collectively and electrically erase some memory cells on a chip and a chip erase mode to electrically erase the whole memory cells on the chip. The following will describe how to electrically erase the whole memory cells included in the cell array MX shown in FIG. 1.

Before the erase mode is set, data "0" is written in all the memory cells. Then, 0 V is applied to the all the X address lines $W_1-W_m$ and all the Y address lines Y1—Y1, and a high voltage $V_{PP}$ to the common source SS. As a result, every NE-MOSFET included in the Y selector YS is turned off, causing all the memory cells to be turned off. The electrons stored in the floating gate of each memory cell are discharged to the source. This drops the threshold value of each memory cell to $V_{TM}(E)$. In general, $V_{TM}(E)$ is designed lower than the power supply voltage $V_{cc}$.

(3) Read Mode

This mode is to read out the contents of a memory cell.

The power supply voltage $V_{cc}$ is applied to the selected X address line $W_1$ and 0 V to the non-selected X address lines, while $V_{cc}$ is applied to the selected Y address line $Y_1$ and 0 V to the non-selected Y address lines. The sense amplifier SA outputs a predetermined bias voltage, e.g., 1.5 V, to bias the digit line $D_1$, connected to the selected memory cell $M_{11}$, via a switch $Q_{Y1}$. The common source SS is applied with 0 V.

With the memory cell $M_{11}$ electrically programmed ("0" stored in that cell), the memory cell $M_{11}$ becomes non-conductive due to the threshold value $V_{TM}(W)$ of the memory cell $M_{11}$ designed higher than $V_{cc}$. The sense amplifier SA detects the status of the memory cell $M_{11}$ and sends "0" to the I/O terminal I/OT.

With the memory cell $M_{11}$ electrically erased ("1" stored in that cell), the memory cell $M_{11}$ becomes conductive due to the threshold value $V_{TM}(E)$ of the memory cell $M_{11}$ designed lower than $V_{cc}$. The sense amplifier SA detects the status of the memory cell $M_{11}$ and sends "1" to the I/O terminal I/OT.

(4) Write Verify Mode

This mode is to check if writing data "0" into a memory cell has been successful or check if the threshold value $V_{TM}(W)$ becomes higher than the power supply voltage $V_{cc}$.

A program verify voltage $V_{PV}$ is applied to the selected X address line $W_1$, and the other nodes and signal lines are applied with the same voltages as done in the read mode.

Assuming that $V_{PV}=7$ V, when the threshold value of the electrically-programmed memory cell $M_{11}$ is lower than 7 V (e.g., $V_{TM}(W)=6$ V), the memory cell $M_{11}$ becomes conductive. The sense amplifier SA detects it and outputs "1" to the I/O terminal I/OT, indicating that the data writing to the memory cell is insufficient.

When the threshold value of the memory cell $M_{11}$ is higher than 7 V (e.g., $V_{TM}(W)=7.5$ V), on the other hand, the memory cell $M_{11}$ becomes non-conductive. The sense amplifier SA detects it and outputs "0" to the I/O terminal I/OT, indicating that the data writing to the memory cell is complete.

(5) Erase Verify Mode

This mode is to check if electric erasing of a memory cell has succeeded or check if the threshold value $V_{TM}(E)$ becomes lower than the power supply voltage $V_{cc}$.

For instance, when the memory cell $M_{11}$ is selected by the address signal after erasing is complete, an erase verify voltage $V_{EV}$ is applied to the selected X address line $W_1$, and the other nodes and signal lines are applied with the same voltages as done in the read mode.

Assuming that $V_{EV}=3.5$ V, when the threshold value of the memory cell $M_{11}$ is higher than 3.5 V (e.g., $V_{TM}(E)=4$ V), the memory cell $M_{11}$ becomes non-conductive. The sense amplifier SA detects it and outputs "0" to the I/O terminal I/OT, indicating that the memory cell has not been erase sufficiently.

When the threshold value of the memory cell $M_{11}$ is lower than 3.5 V (e.g., $V_{TM}(E)=3$ V), on the other hand, the memory cell $M_{11}$ becomes conductive. The sense amplifier SA detects and outputs "1" to the I/O terminal I/OT, indicating that electrical erasing of the memory cell is complete.

The erase mode and erase verify mode are generally performed as a sequential operation.

FIG. 3 presents a flowchart illustrating this sequential operation. This flowchart is extracted from FIG. 3 in IEEE Journal of Solid-State Circuits, Vol. 24, No. 5, October 1989, pages 1259–1263, "A 90-ns One-Million Erase/Program Cycle 1-Mbit Flash Memory." The contents of this article are incorporated in this specification by reference.

FIG. 2 exemplifies a conventional X decoder (X-DEC). In FIG. 2, the signal line VW is applied with the high voltage $V_{PP}$ in write mode and erase mode, with the power supply voltage $V_{CC}$ in read mode, with the verify voltage $V_{PV}$ in write verify mode, and with the erase verify voltage $V_{EV}$ in erase verify mode, as apparent from Table 1. As also apparent from Table 1, the signal line B(W+V) is applied with the power supply voltage $V_{cc}$ in read mode and with 0 V in the other modes.

An address and a signal ER, which becomes "H" (high) only in erase mode and "L" (low) otherwise, are input to a NOR circuit NOR1. The reference symbol "$Q_{X1}$" denotes an N-channel depletion MOSFET (ND-MOSFET), and the reference symbols "$Q_{x2}$," "$Q_{x4}$," "$Q_{x12}$," "$Q_{x22}$" and "$Q_{Xn2}$" denote P-channel enhancement MOSFET's (PE-MOSFET's) whose substrates are connected to the signal line VW. The reference symbols "$Q_{X3}$," "$Q_{X11}$," "$Q_{X13}$," "$Q_{X21}$," "$Q_{X23}$," "$Q_{Xn3}$" denote N-channel enhancement MOSFET's (NE-MOSFET's). Unless otherwise specified, the substrates of the NE-MOSFET's are connected to the ground line (GND). Let us assume that the threshold value ($V_{TD}$) of the ND-MOSFET is set to $V_{TD}=-2.5$ V.

Referring to FIG. 2 and Table 1, the operation of the conventional X decoder will be described below. Suppose that all the address signals input to the NOR circuit NOR1 have become "L" to select the illustrated X decoder and the X address line $W_1$ has been selected by the signal lines $X_1$, $BX_1$, $X_2$, $BX_2$, ..., $X_n$ and $BX_n$.

(1) Write Mode

The signal lines are set as follows: $VW=V_{PP}$, $B(W+V)=0$ V, $X_1=V_{PP}$, $X_2$ to $X_n=0$ V, $BX_1=0$ V and $BX_2$ to $BX_n=V_{PP}$. Further, the power supply voltage $V_{cc}$ is applied to the node XA, and the absolute value of the threshold value of the ND-MOSFET $Q_{X1}$, 2.5 V, is applied to the node XB. An inverter which is constituted of the MOSFET's $Q_{X2}$ and $Q_{X3}$ inverts the voltage at the node XA and applies 0 V to the node XC, turning on the MOSFET $Q_{X4}$. The MOSFET's $Q_{X11}$ and $Q_{X12}$ are turned on, and the MOSFET's $Q_{X21}$, $Q_{X22}$, ..., $X_{Xn1}$ and $Q_{Xn2}$ are rendered non-conductive. As the MOSFET $Q_{X13}$ is non-conductive and the MOSFET's $Q_{X23}$, ..., and $X_{Xn3}$ are conductive, the voltages at the nodes XB and $X_{D1}$ rise from 0 V to $V_{PP}$. The nodes $X_{D2}$ to $X_{Dn}$ are discharged to 0 V by the MOSFET's $Q_{X23}$ to $Q_{Xn3}$, respectively. Therefore, the high voltage $V_{PP}$ is applied to the selected X address line $W_1$, and 0 V to the non-selected X address lines $W_2$ to $W_n$.

(2) Erase Mode

The signal lines are set as follows: $VW=V_{PP}$, $B(W+V)=0$ V, $X_1$ to $X_n=0$ V, and $BX_1$ to $BX_n=V_{PP}$. The nodes XA and XB are discharged to 0 V, and the nodes $X_{D1}$, $X_{D2}$, ..., and $X_{Dn}$ are discharged via the MOSFET's $Q_{X13}$, $Q_{X23}$, ..., $Q_{Xn3}$, respectively, setting the all the X address lines $W_1$, $W_2$, ..., and $W_n$ to 0 V.

(3) Read Mode

The signal lines are set as follows: $VW=V_{CC}$, $B(W+V)=V_{CC}$, $X_1=V_{CC}$, $X_2$ to $X_n=0$ V, $BX_1=0$ V and $BX_2$ to $BX_n=V_{CC}$. The MOSFET's $Q_{X11}$ and $Q_{X12}$ are turned on, and the MOSFET $Q_{X13}$ is turned off as in the write mode, so that power supply voltage $V_{CC}$ is applied to the selected X address line $W_1$.

(4) Write Verify Mode

The signal lines are set as follows: $VW=V_{PP}$, $B(W+V)=0$ V, $X_1=V_{CC}$, $X_2$ to $X_n=0$ V, $BX_1=0$ V and $BX_2$ to $BX_n=V_{CC}$. The power supply voltage $V_{CC}$ is applied to the node XA. As the absolute value of the threshold value of the ND-MOS- FET $Q_{X1}$ is 2.5 V, the node XB is charged to 2.5 V. When the voltage at the node XC is changed to 0 V, the MOSFET $Q_{X4}$ is turned on. Then, the voltage at the node XB rises to the write verify voltage $V_{PV}$. The MOSFET's $Q_{X11}$ and $Q_{X12}$ are turned on, and the MOSFET's $Q_{X21}, Q_{X22}, \ldots, X_{Xn1}$ and $Q_{Xn2}$ are turned off. Therefore, the write verify high voltage $V_{PV}$ is applied to the selected X address line $W_1$, and 0 V to the non-selected X address lines $W_2$ to $W_n$.

(5) Erase Verify Mode

The signal lines are set as follows: $VW=V_{EV}$, $B(W+V)=0$ V, $X_1=V_{CC}$, $X_2$ to $X_n=0$ V, $BX_1=0$ V and $BX_2$ to $BX_n=V_{CC}$. Therefore, the read verify voltage $V_{EV}$ is applied to the selected X address line $W_1$, and 0 V to the non-selected X address lines $W_2$ to $W_n$.

A change in the threshold value of a memory cell in erase mode will now be explained in detail.

As mentioned earlier, erasing a memory cell is executed in the sequence illustrated in FIG. 3. In general, a plurality of memory cells are electrically and collectively erased using an erase pulse signal as short as 10 μs. Then, it is checked if erasing each memory cell is complete. If there is any memory cell whose erasing is not completed, erasure and verification are repeated. If there is even one memory cell whose erasing speed is slow, all of the other memory cells are repeatedly erased, lowering the threshold value $V_{TM}(E)$.

FIG. 4 illustrates the relationship between the cumulative value tPe of the applying time of the erase pulse that is applied to the memory cells and the threshold value $V_{TM}(E)$ of the memory cells for the memory cell having the fastest erasing speed (characteristic Q), the memory cell having the slowest erasing speed (characteristic P), and the memory cell whose erasing speed become abnormally fast due to a variation in the manufacturing process (characteristic R).

When the cumulative time for the erase pulse is t1, the threshold value of the memory cell having the slowest erasing speed is higher than the erase verify voltage $V_{EV}$ as shown by the characteristic P, so that erasing and verifying the memory cells will be further repeated.

At the cumulative time t2, even the threshold value of the memory cell having the slowest erasing speed becomes lower than the erase verify voltage $V_{EV}$. Accordingly, it is detected that erasing all the memory cells has been completed. At this time, the threshold value of the memory cell having the fastest erasing speed is about 2.0 V as shown by the characteristic Q.

The threshold value of the memory cell whose erasing speed is abnormally fast is abnormally dropped to 0.5 V as shown by the characteristic R.

When the threshold value of the memory cell falls further to take a negative value, this memory cell is rendered conductive even when it is not selected. As a result, the flash EEPROM will malfunction. The flash EEPROM should therefore fulfill the requirement that the threshold value $V_{TM}(E)$ of the memory cell having the fastest erasing speed does not become equal to or below 0 V when erasing the memory cell having the slowest erasing speed is completed.

A phenomenon that a non-selected memory cell is rendered conductive by the parasitic capacitance between the drain and floating gate of the memory cell is a factor to determine the lower limit of the threshold value $V_{TM}(E)$ of the erased memory cell. This phenomenon will be described below.

FIG. 5 is a cross section of a memory cell of a flash EEPROM. A control gate CG is connected to the X address line.

FIG. 6 shows an equivalent circuit of the capacitance component accompanying the memory cell shown in FIG. 5. In FIG. 6, $C_{CF}$ represents the capacitance between the control gate CG and the floating gate FG, $C_{FD}$ represents the capacitance between the floating gate FG and the drain D, and $C_{FS}$ represents the capacitance between the floating gate FG and the source S. As shown in FIG. 6, the floating gate FG is capacitively coupled to the drain D and source S through a tunnel oxide film TI, and is capacitively coupled to the control gate CG through an interlayer insulating film IV (the P substrate is set to 0 V). Thus, the voltage $V_{FG}$ of the floating gate FG when a voltage $V_{CG}$ is applied to the control gate CG is given by an equation 1, and the voltage $V_{FG}$ of the floating gate FG when a voltage $V_D$ is applied to the drain D is given by an equation 2.

$$V_{FG}=(C_{CF} \times V_{CG})/(C_{FS}+C_{FCC}+C_{FD}+C_{CF}) \qquad (1)$$

$$V_{FG}=(C_{FD} \times V_D)/(C_{CF}+C_{FS}+C_{FCC}) \qquad (2)$$

Given that $C_{CF}=5.0\times10^{-3}$ PF, $C_{FS}=2.0\times10^{-3}$ PF, $C_{FD}=1.0\times10^{-3}$ PF, and $C_{FCC}2.0\times10^{-3}$ PF, an equation 3 below is derived from the equation 1, and an equation 4 below from the equation 2.
s $$V_{FG}=0.5 \times V_{CG} \qquad (3)$$

$$V_{FG}=0.1 \times V_D \qquad (4)$$

It is apparent from equations 3 and 4 that the influence of the voltage $V_D$ of the drain on the voltage $V_{FG}$ of the floating gate is ⅕ of the influence of the voltage $V_{CG}$ of the control gate on the voltage $V_{FG}$ of the floating gate.

On the assumption that the drain voltage $V_D$ in write mode is set to 5 V, a description will be given of how a non-selected memory cell is rendered conductive by the parasitic capacitance between the drain and floating gate of the memory cell, referring to FIGS. 1 and 5 to 7.

In writing data in the memory cell $M_{11}$, 5 V is applied to the digit line $D_1$, a high voltage $V_{PP}$ to the X address line $W_1$, and 0 V to the other X address lines. Thus, 5 V is applied to the drain D of a memory cell other than $M_{11}$ and connected to the digit line $D_1$, e.g., $M_{1m}$, and 0 V is applied to the control gate CG and source S of that memory cell $M_{1m}$. It is apparent from the equations 3 and 4, that 5 V applied to the drain D is equivalent to 1 V applied to the control gate CG. When the threshold value of the memory cell $M_{1m}$ is 1 V or below, the memory cell $M_{1m}$ becomes conductive even through 0 V is applied to the control gate CG.

FIG. 7 illustrates the relationship between the drain voltage $V_D$ of a non-selected memory cell and the drain current $I_D$. With the threshold value of the non-selected memory cell being 1 V, the drain voltage $V_{FD}$ when the non-selected memory cell is turned on is 5 V.

When any non-selected memory cell is turned on, the voltage of the selected digit line drops, so that the writing speed may become slow or writing may not be possible.

To avoid such a problem, it is essential to check if the threshold value of an erased memory cell does not cause the non-selected memory cell to be turned on due to $C_{FD}$. Conventionally, however, no measures have been taken to check if the threshold value of an erased memory cell is below the lower limit.

In short, in erasing the conventional flash EEPROM, if there is any memory cell whose erasing is not completed, all the memory cell are erased. If there is even one memory cell whose erasing speed is abnormally fast due to a variation in the fabrication process or some other reasons, therefore, the threshold value may become negative, causing that memory cell to be always turned on.

Even when the threshold value does not become negative, a non-selected memory cell connected to the selected digit line may be turned on, slowing the writing of the selected memory cell or disabling the writing.

SUMMARY OF THE INVENTION

It is therefore an object of the present invention to provide a highly reliable memory cell.

It is another object of the present invention to provide an EEPROM capable of checking if the threshold value of an erased memory cell is below a predetermined lower limit.

It is also an object of the present invention to provide a method of checking if an EEPROM contains any memory cell whose threshold value, after erasure, is below a predetermined lower limit, and removing that EEPROM as a defect if such cell exists.

To achieve the foregoing objects, a non-volatile semiconductor memory device according to the first aspect of the present invention comprises:

a plurality of row address lines;

a plurality of digit lines;

means for sensing and amplifying signals on the digit lines and outputting the amplified signals;

a plurality of memory cells each having a current path one end of which is connected to an associated one of the digit lines and having a gate connected to an associated one of the row address lines; and read means for applying a same predetermined voltage to all of the row address lines to read out stored data from the memory cells.

A memory cell checking method according to the second aspect of the present invention comprises:

an erasing step of electrically erasing a plurality of memory cells of a memory chip;

a checking step, performed after the erasing step, of checking if threshold values of the memory cells are equal to or above a reference value; and a step of discriminating the memory chip as a defect when a memory cell whose threshold value is below the reference value is detected in the checking step.

With the structure and method according to the first and second aspects of this invention, it is possible to check if the threshold value of an erased memory cell is equal to or greater than a predetermined value. Thus, a chip containing a memory cell, which has been over-erased to have its threshold value abnormally low, can be removed as a defect.

DETAILED DESCRIPTION OF THE PREFERRED EMBODIMENTS

Preferred embodiments of the present invention will now be described referring to the accompanying drawings.

Figure 2:
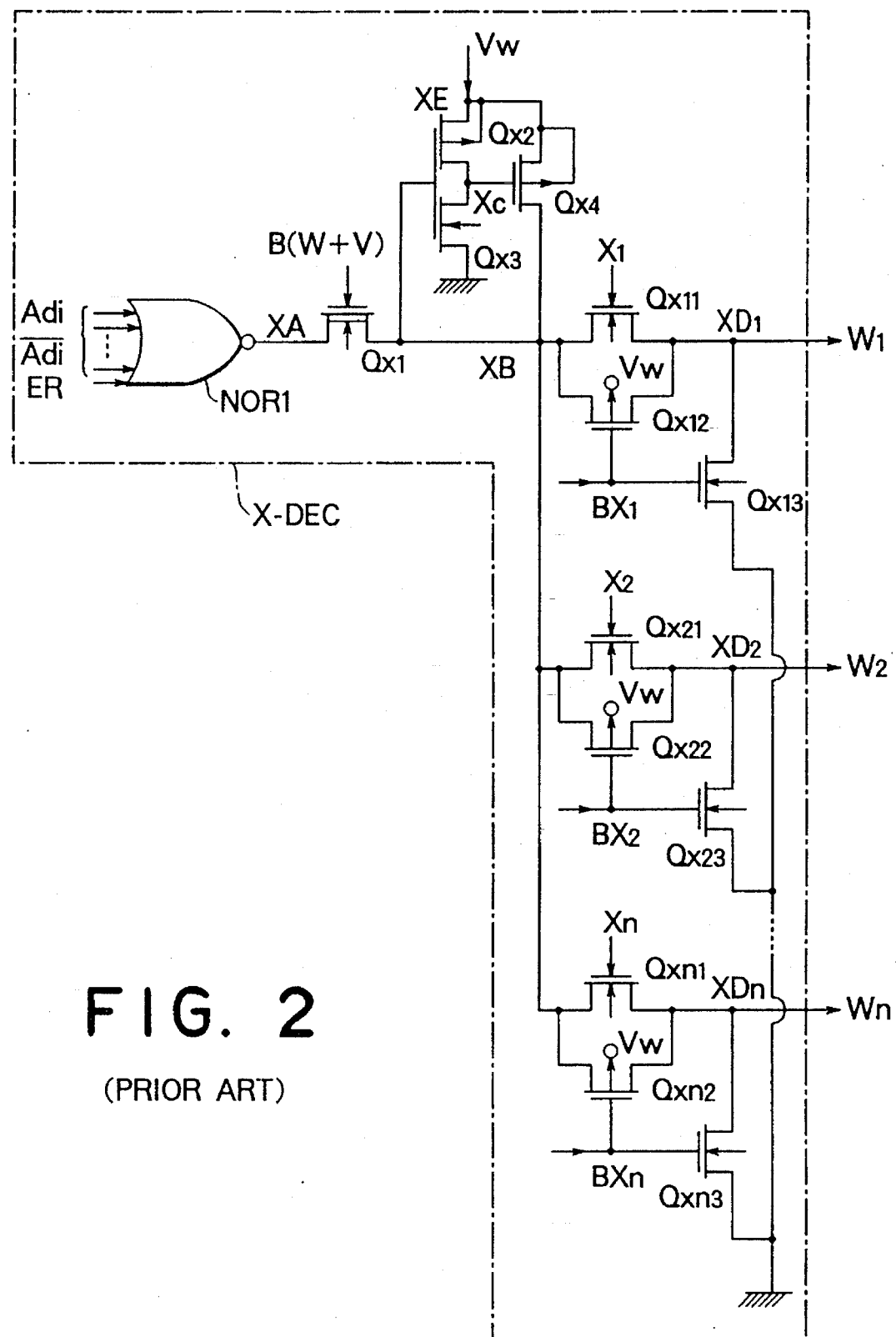
FIG. 2 is a circuit diagram showing the structure of a conventional X decoder.
Figure 8:
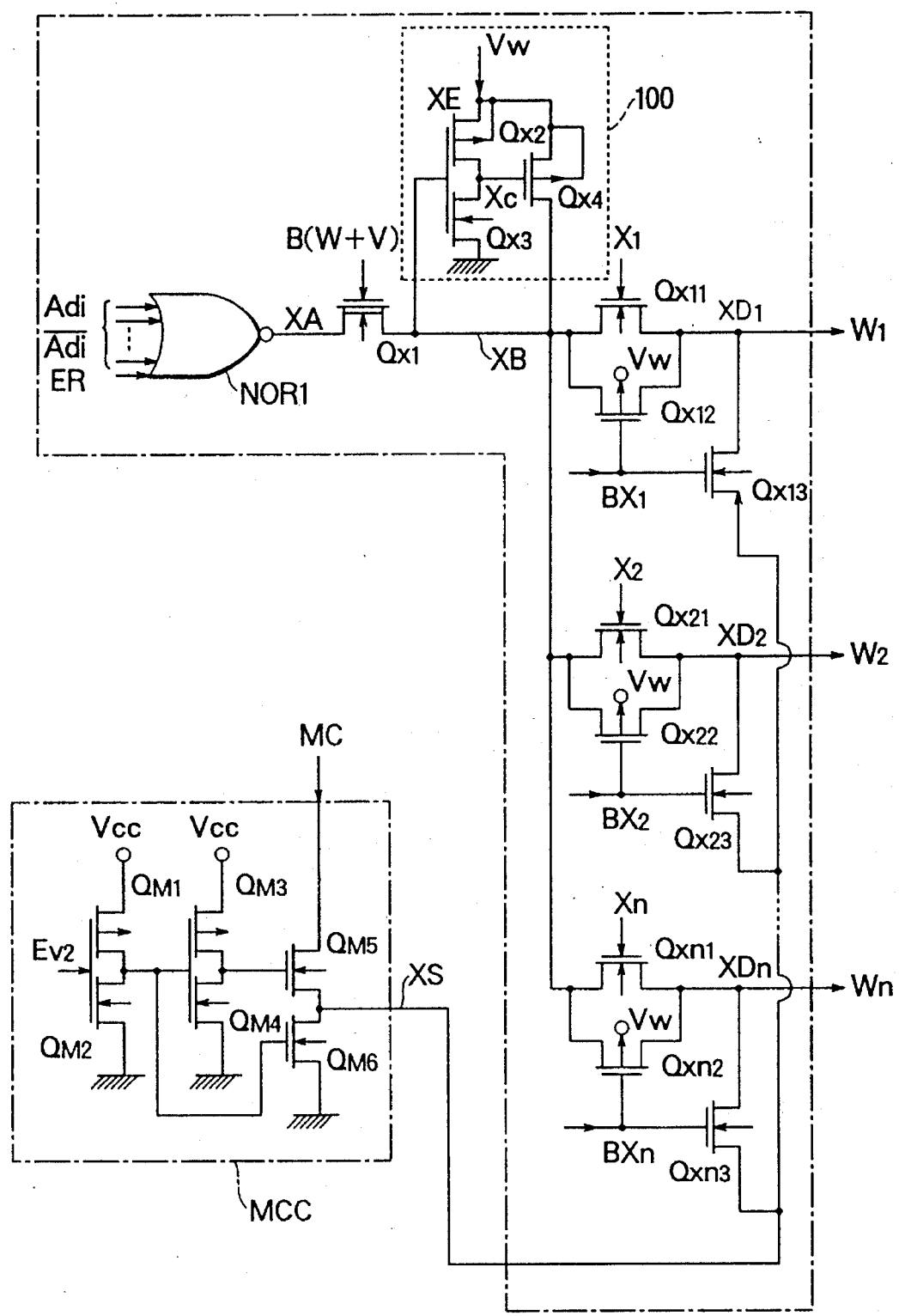
FIG. 8 is a circuit diagram showing the structure of an X decoder according to a first embodiment of the present invention.

FIG. 8 illustrates the structure of an X decoder according to the first embodiment of the present invention. This X decoder is the conventional X decoder in FIG. 2 to which a margin check voltage application control circuit MCC is added. Like or same reference numerals and symbols as used in FIG. 2 are also used in FIG. 8 to avoid repeating their explanation.

The control circuit MCC outputs a voltage equal to a lower limit $V_{MC}$ of the threshold value, determined by the designing of memory cells, to a node XS in erase margin check mode. The erase margin check mode is characterizing this embodiment and is to check if the threshold value of an erased memory cell is higher than the lower limit $V_{MC}$ that is determined by the designing of memory cells.

The control circuit MCC comprises PE-MOSFET's $Q_{M1}$ and $Q_{M3}$, and NE-MOSFET's $Q_{M2}$, $Q_{M4}$, $Q_{M5}$ and $Q_{M}6$. A signal line $EV_2$ is connected to a first inverter comprising the MOSFET's $Q_{M1}$ and $Q_{M2}$. Applied to this signal line $EV_2$ is a signal, which becomes a high level in erase margin check mode and a low level otherwise.

The output of the first inverter is supplied to a second inverter, which comprises the MOSFET's $Q_{M3}$ and $Q_{M4}$, and the gate of the MOSFET $Q_{M6}$. The output of the second inverter is supplied to the gate of the MOSFET $Q_{M5}$.

The NE-MOSFET $Q_{M5}$ has a drain connected to a signal line MC and a source connected to both the node XS and the drain of the NE-MOSFET $Q_{M6}$. Applied to the signal line MC is $V_{TM}(E)min=V_{MC}$, the lower limit of the threshold value of an erased memory cell, which is determined by the cell design. The node XS is connected to the sources of NE-MOSFET's $Q_{X13}$, $Q_{X23}$, . . . , and $Q_{Xn3}$ that pull down X address lines $W_1$ to $W_m$.

Figure 1:
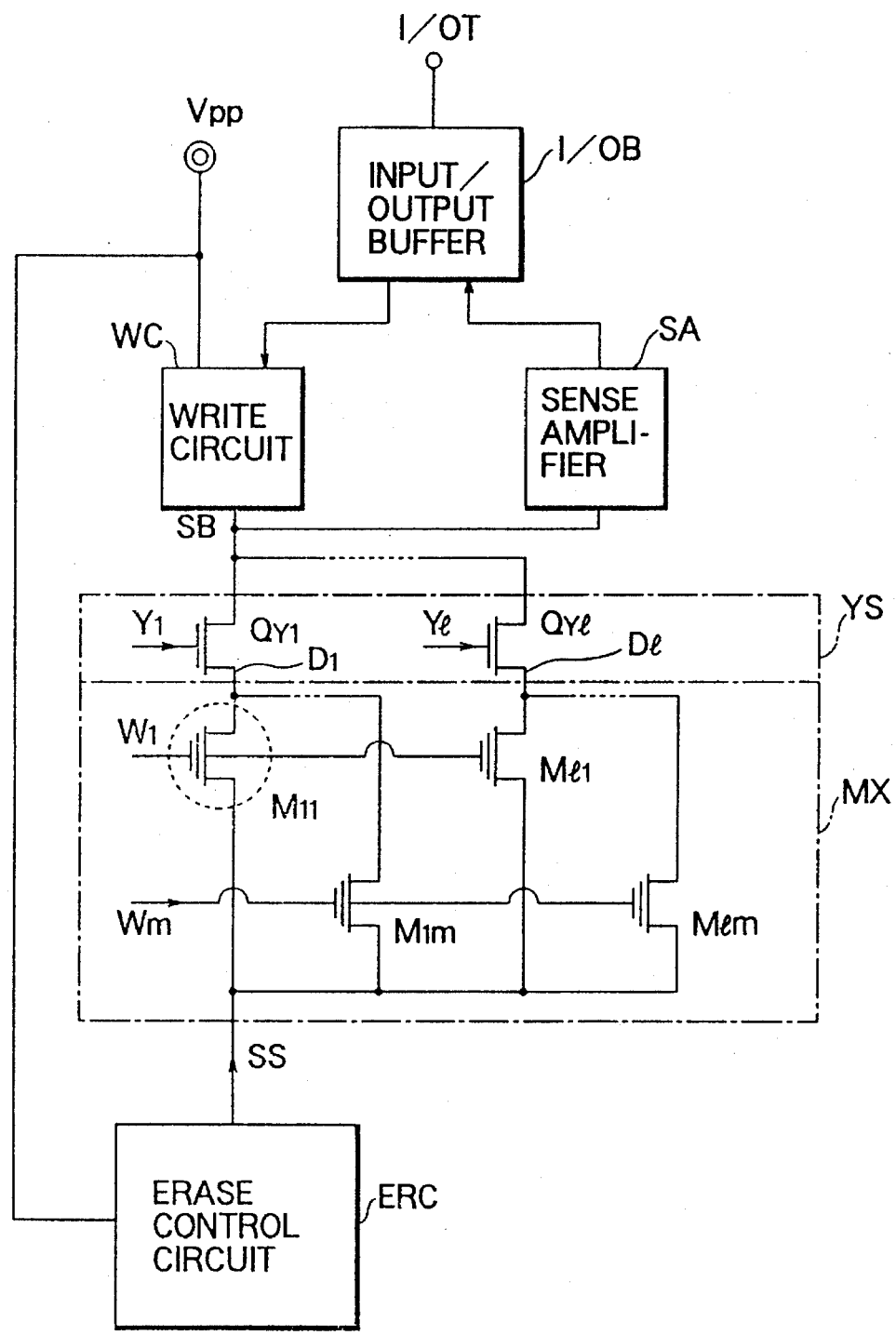
FIG. 1 is a block diagram illustrating the structure of a conventional EEPROM.
Figure 9:
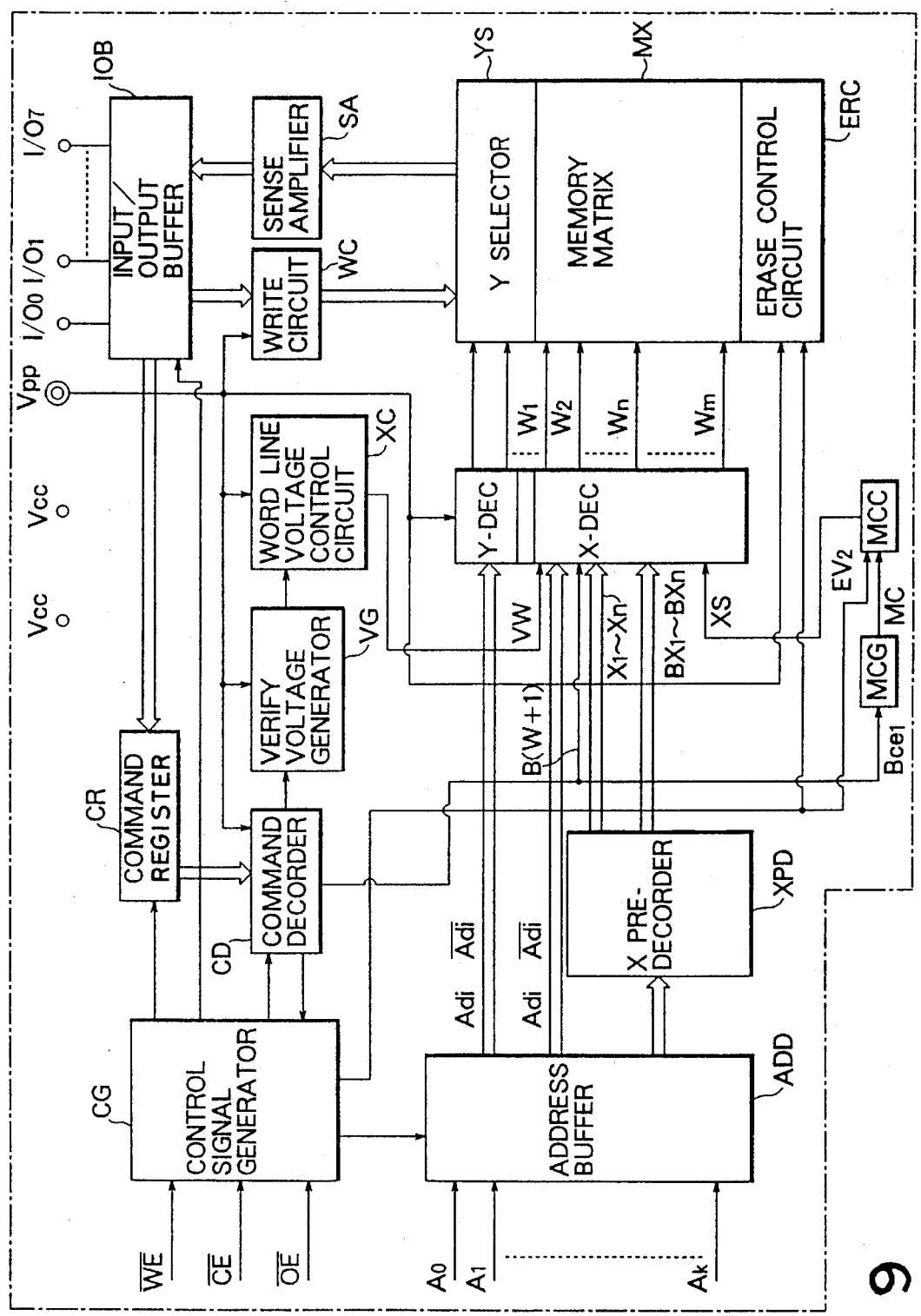
FIG. 9 is a block diagram showing the structure of a flash EEPROM according to the first embodiment of this invention.

FIG. 9 shows the structure of a flash EEPROM according to the first embodiment. This flash EEPROM is constructed by adding the aforementioned margin check voltage application control circuit MCC and a margin check voltage generator MCG for generating the mentioned margin check voltage $V_{MC}$ to the conventional type in FIG. 1.

Figure 10:
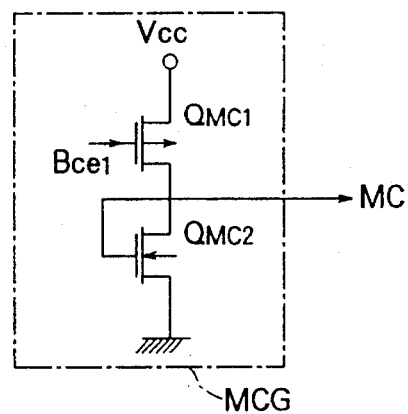
FIG. 10 is a circuit diagram showing one example of a margin check voltage generator shown in FIG. 9.
Figure 11:
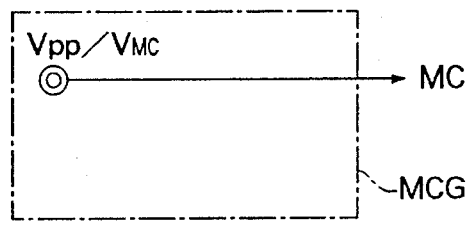
FIG. 11 is a circuit diagram showing another example of the margin check voltage generator.

FIGS. 10 and 11 illustrate examples of the margin check voltage generator MCG. Referring to FIG. 10, a PE-MOSFET $Q_{MC1}$ is connected between the power supply voltage $V_{CC}$ and the signal line MC, and has a gate supplied with a signal BCel, which becomes a high level in standby mode and a low level otherwise. An NE-MOSFET $Q_{MC2}$ has its drain and gate connected to the signal line MC, with its source grounded.

To reduce the dependency of the margin check voltage $V_{MC}$ on the power supply voltage $V_{CC}$, the current driving ability of the NE-MOSFET $Q_{MC2}$ is designed to be sufficiently larger than that of the PE-MOSFET $Q_{MC1}$. Given that the threshold value of the NE-MOSFET $Q_{MC2}$ is $V_{TN2}$, the margin check voltage $V_{MC}$ is approximately equal to $V_{TN2}$. By properly setting the threshold value $V_{TN2}$ of the NE-MOSFET $Q_{MC2}$, therefore, the margin check voltage $V_{MC}$ can be set to the lower limit $V_{TM}(E)$min that is determined by the designing of memory cells.

FIG. 11 illustrates an example of the margin check voltage generator MCG in the case where the voltage of the signal line MC is controlled by a voltage supplied outside the chip. The margin check voltage $V_{MC}$ is applied to a terminal $V_{PP}$ at the stage of checking the functions of the chip, and the high voltage $V_{PP}$ is applied there in the other modes.

The operation of the X decoder according to this embodiment will be described referring to FIGS. 8, 10 and 12 and Table 2 below.

TABLE 2

| Signal line or node | $W_1$ | $Y_1$ | $D_1$ | SS | VW | B(W+V) |
|---|---|---|---|---|---|---|
| Mode | | | | | | |
| Write (P) | $V_{PP}$ | $V_{PP}$ | $V_{PP}-V_{TN}$ or 0 | 0 | $V_{PP}$ | 0 |
| Erase (E) | 0 | 0 | open | $V_{PP}$ | $V_{PP}$ | 0 |
| Read (R) | $V_{CC}$ | $V_{CC}$ | 1.5 V | 0 | $V_{CC}$ | $V_{CC}$ |
| Write Verify (PV) | $V_{PV}$ | $V_{CC}$ | 1.5 V | 0 | $V_{PV}$ | 0 |
| Erase Verify (EV) | $V_{EV}$ | $V_{CC}$ | 1.5 V | 0 | $V_{EV}$ | 0 |
| Erase Margin Check (EV$_2$) | $V_{MC}$ | $V_{CC}$ | 1.5 V | 0 | $V_{CC}$ | $V_{CC}$ |

Figure 12:
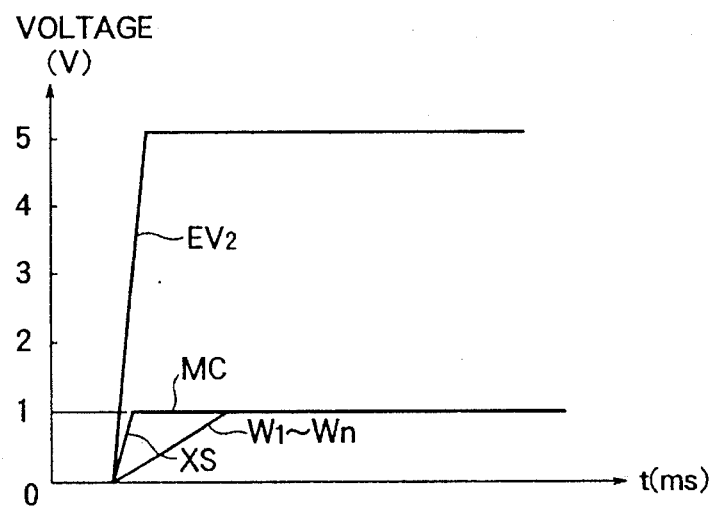
FIG. 12 is a timing chart for explaining the operation of the flash EEPROM in erase margin check mode.

FIG. 12 shows changes in voltages of the signal lines and the nodes in erase margin check mode. Table 2 shows voltages of the individual sections in each mode of the flash EEPROM according to this embodiment.

Since the voltage of the signal line EV$_2$ is set to a low level in other modes than the erase margin check mode, the NE-MOSFET $Q_{M5}$ is turned off and the MOSFET $Q_{M6}$ is turned on. Consequently, 0 V is applied to the node XS, allowing the X decoder in FIG. 8 to operate in the same fashion as the conventional X decoder in FIG. 2.

In erase margin check mode, the voltage settings are VW=$V_{CC}$, B(W+V)=$V_{CC}$, $X_1$ to $X_n$=0 V and $BX_1$ to $BX_n$=$V_{CC}$. Further, the power supply voltage $V_{CC}$ is applied to the selected Y address line $Y_1$, and 0 V to the non-selected Y address lines.

Assuming that the threshold value of the MOSFET $Q_{MC2}$, $V_{TN2}$, is designed to 1 V, the voltage $V_{MC}$ of the signal line MC becomes 1 V. When the mode becomes the erase margin check mode, the voltage of the signal line EV$_2$ changes to a high level from the low level. This turns on the MOSFET $Q_{M5}$ and turns off the MOSFET $Q_{M6}$, so that the voltage at the node XS changes to 1 V from 0 V. The MOSFET's $Q_{X11}$, $Q_{X12}$, $Q_{X21}$, $Q_{X22}$, ..., $X_{Xn1}$, and $Q_{Xn2}$ are all turned off, and MOSFET's $Q_{X13}$, $Q_{X23}$, ..., and $Q_{Xn3}$ are all turned on. This causes all the voltages at the nodes $XD_1$, $XD_2$, ..., and $XD_n$ to be $V_{MC}$ (=1 V), so that the X address lines $W_1$, ..., and $W_n$ all become 1 V.

Therefore, 1 V is applied to the control gates CG of all the memory cells $M_{11}$, ..., and $M_{1m}$ connected to the selected digit line $D_1$. If the threshold value of the memory cell $M_{11}$ is lower than 1 V, the MOSFET $Q_{M11}$ becomes conductive, and the sense amplifier SA detects this event and outputs "0" to the I/O terminal I/OT. As a result, it is detected that there is at least one over-erased memory cell among those connected to the digit line $D_1$ whose threshold value is lower than the lower limit $V_{TM}(E)$min.

By carrying out the above-described operation for each digit line (by switching the NE-MOSFET's $Q_{Y1}$, ..., and $Q_{Y1}$ of the Y selector group), it is possible to check if the threshold values of the all the memory cells are equal to or above the lower limit $V_{TM}(E)$min that is determined by the cell design. When this operation is performed on finished memory chips at a final stage of a manufacturing process, a chip having an over-erased memory cell can be removed as a defect.

Figure 3:
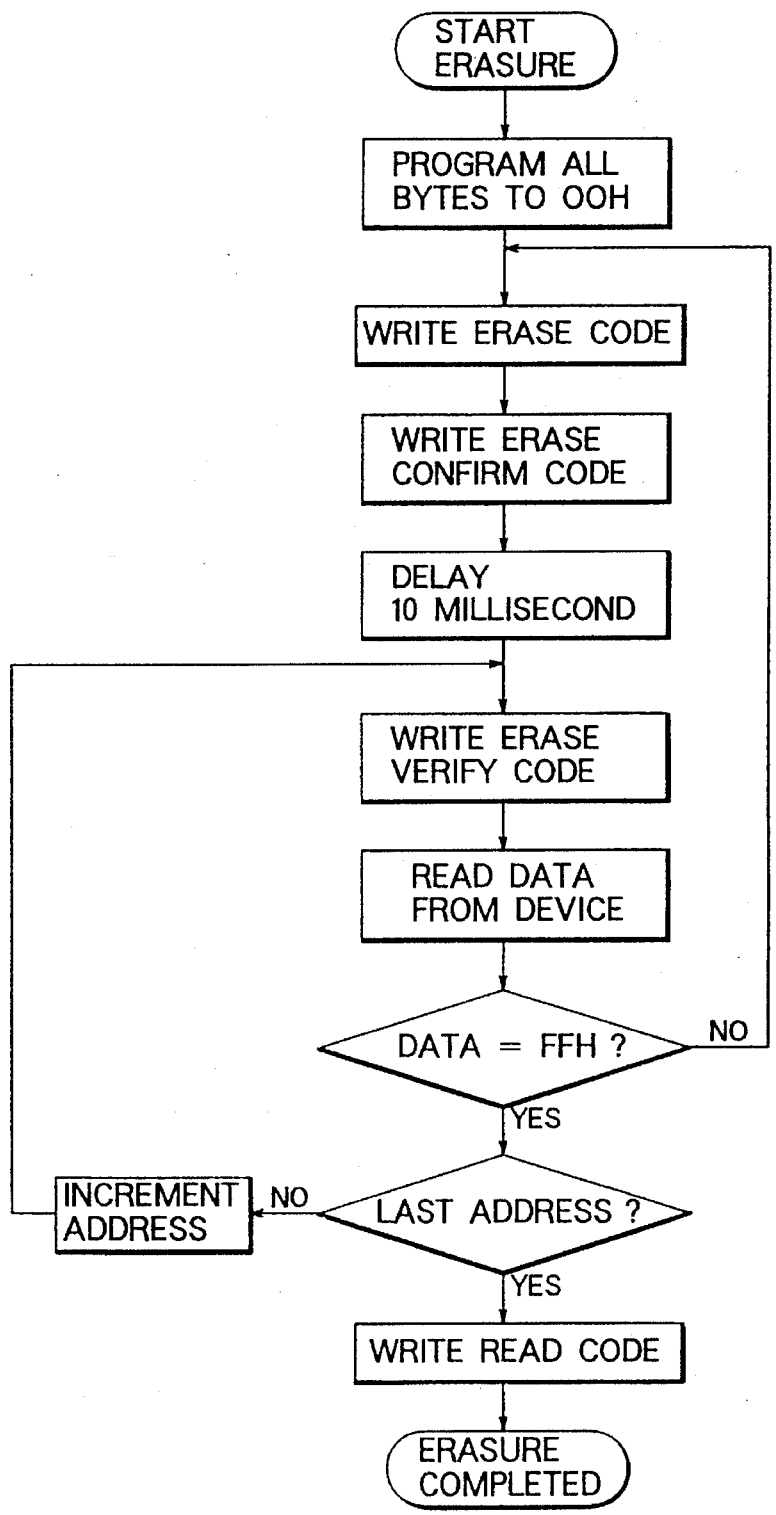
FIG. 3 is a flowchart illustrating an erasure operation for the conventional EEPROM.
Figure 13:
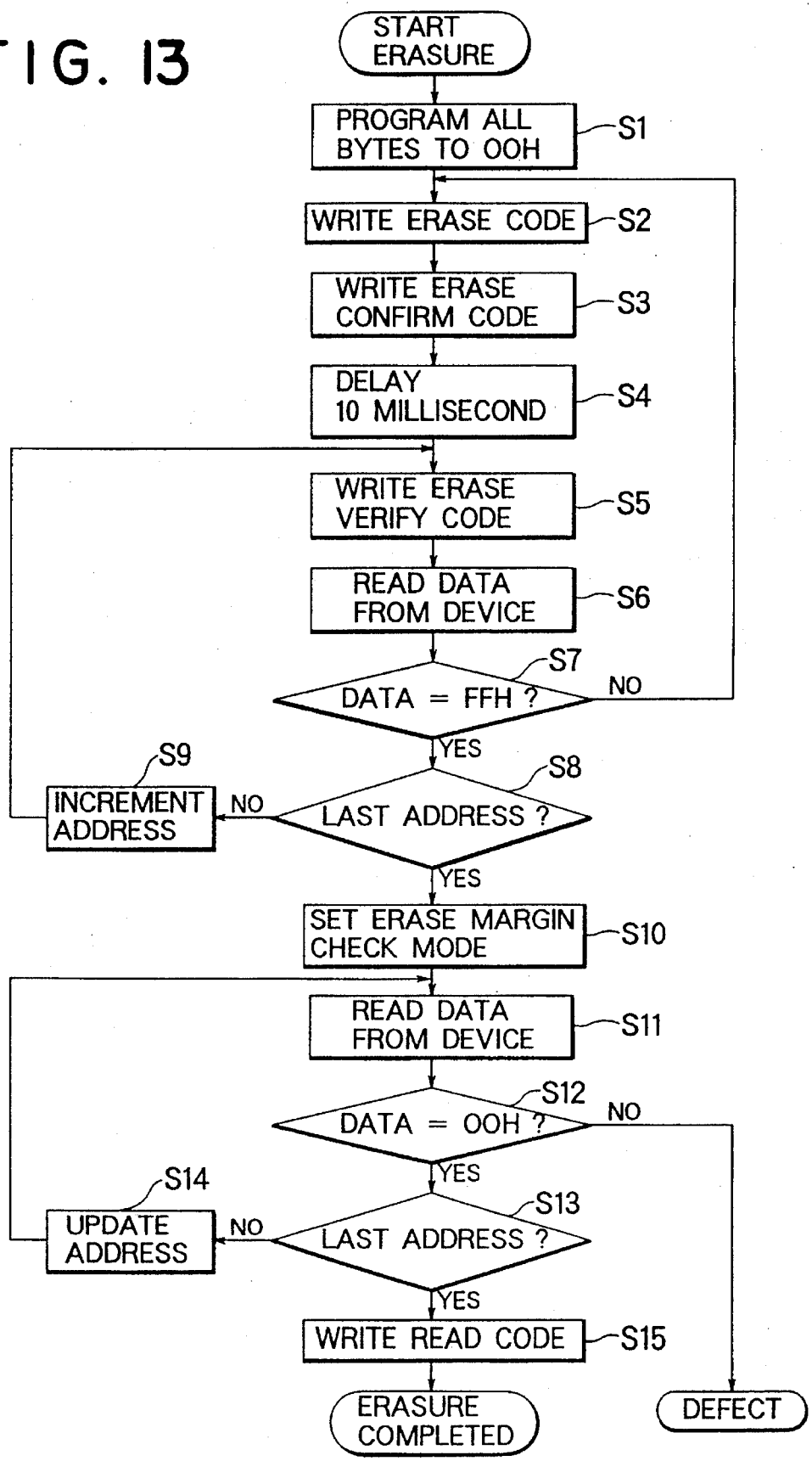
FIG. 13 is a timing chart for explaining the operation of the flash EEPROM in erase mode.

The flash EEPROM according to this embodiment can be set to the erase margin check mode as well as the normal erase mode and erase verify mode. The erasure, the erase verify and erase margin check are thus performed as one sequence. FIG. 13 presents a flowchart for this sequential operation, and is the flowchart in FIG. 3 to which steps for the erase margin check are added.

The operation of the flash EEPROM of this embodiment in erase mode will now be described referring to FIG. 13.

First, to set the threshold values of the memory cells constant, data "0" is written in every memory cell (S1).

Then, the erase mode is set to collectively and electrically erase the memory cells in the chip (S2). Then, the erase verify mode is set (S3), and data stored in the memory cells are read out in order (S4–S9). When an insufficiently-erased memory cell is found, the memory cells are collectively erased again (S7, S2–S9). The above erasing operation and verifying operation are repeated until the completion of erasing all the memory cells is detected.

When erasing all the memory cells is detected (YES in S8), the erase margin check mode is set (S10).

Figure 4:
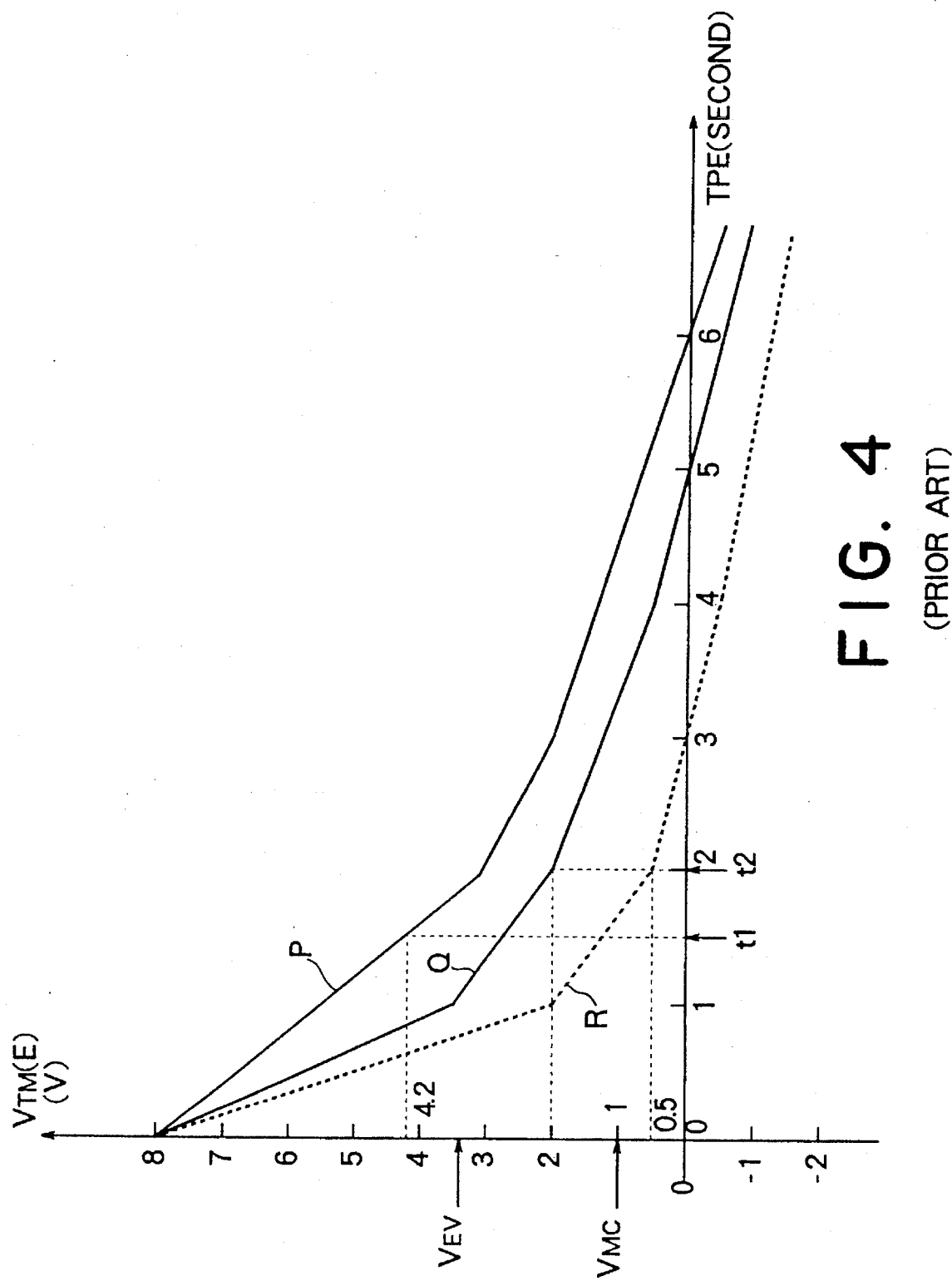
FIG. 4 is a graph showing the relationship between the cumulative value tPe of the applying time of an erase pulse and the threshold value of memory cells.
Figure 5:
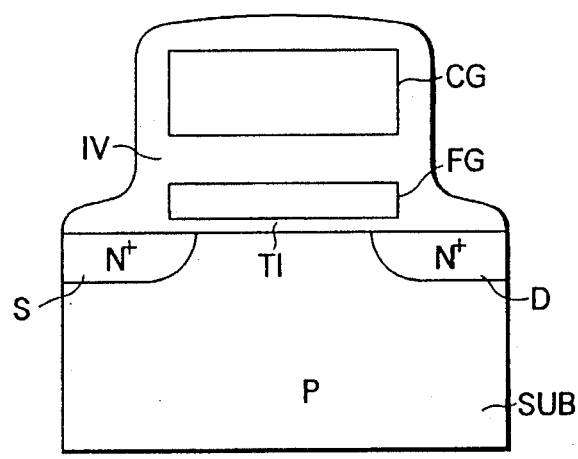
FIG. 5 is a cross section of a memory cell of a flash EEPROM.
Figure 6:
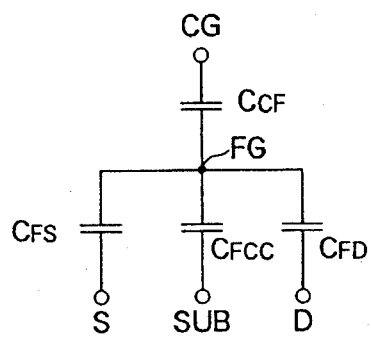
FIG. 6 is a circuit diagram showing an equivalent circuit of the capacitance that accompanies a memory cell.
Figure 7:
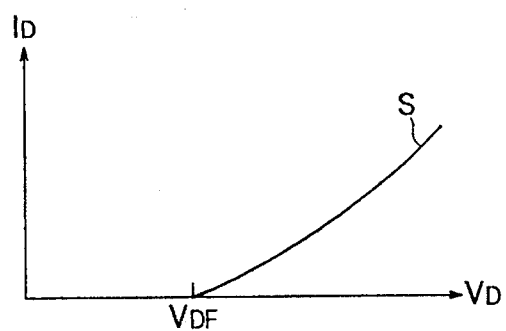
FIG. 7 is a graph illustrating the relationship between the drain voltage and drain current of a non-selected memory cell.

In this mode, as described earlier, the margin check voltage $V_{MC}$ is applied to all the word lines $W_1$–$W_n$, and the MOSFET's $Q_{Y1}$—$Q_{Y1}$ are sequentially turned on to select the digit lines $D_1$—$D_1$ in order (S11–S14). If there is any over-erased memory cell (one having the characteristic R in FIG. 4), that memory cell will become conductive. The sense amplifier SA detects this event and outputs "1" to the I/O terminal I/OT. The chip containing such an over-erased memory cell is discriminated as a defect (S12).

If there is no over-erased memory cell, however, all the memory cells remain off, and the sense amplifier SA outputs "0" to the I/O terminal I/OT for all the digit lines. Then, the read mode is set (S15).

According to this embodiment, therefore, it is possible to detect a memory chip which contains a memory cell whose erasing speed is abnormally fast due to a variation in the manufacturing process or some other reasons and remove it as a defect.

Although a logical gate to which the address is input is a NOR circuit is used in FIG. 8, it may be accomplished by a combination of a NAND circuit and an inverter. A high-voltage supplying circuit 100 is in no way limited to the one shown in FIG. 8, but it may take any structure as long as the circuit can supply a high voltage to the node XB in write mode. While a NE-MOSFET and a PE-MOSFET are connected in parallel, like the MOSFET's $Q_{X11}$ and $Q_{X12}$, in FIG. 8, the NE-MOSFET or PE-MOSFET may be used alone.

Figure 14:
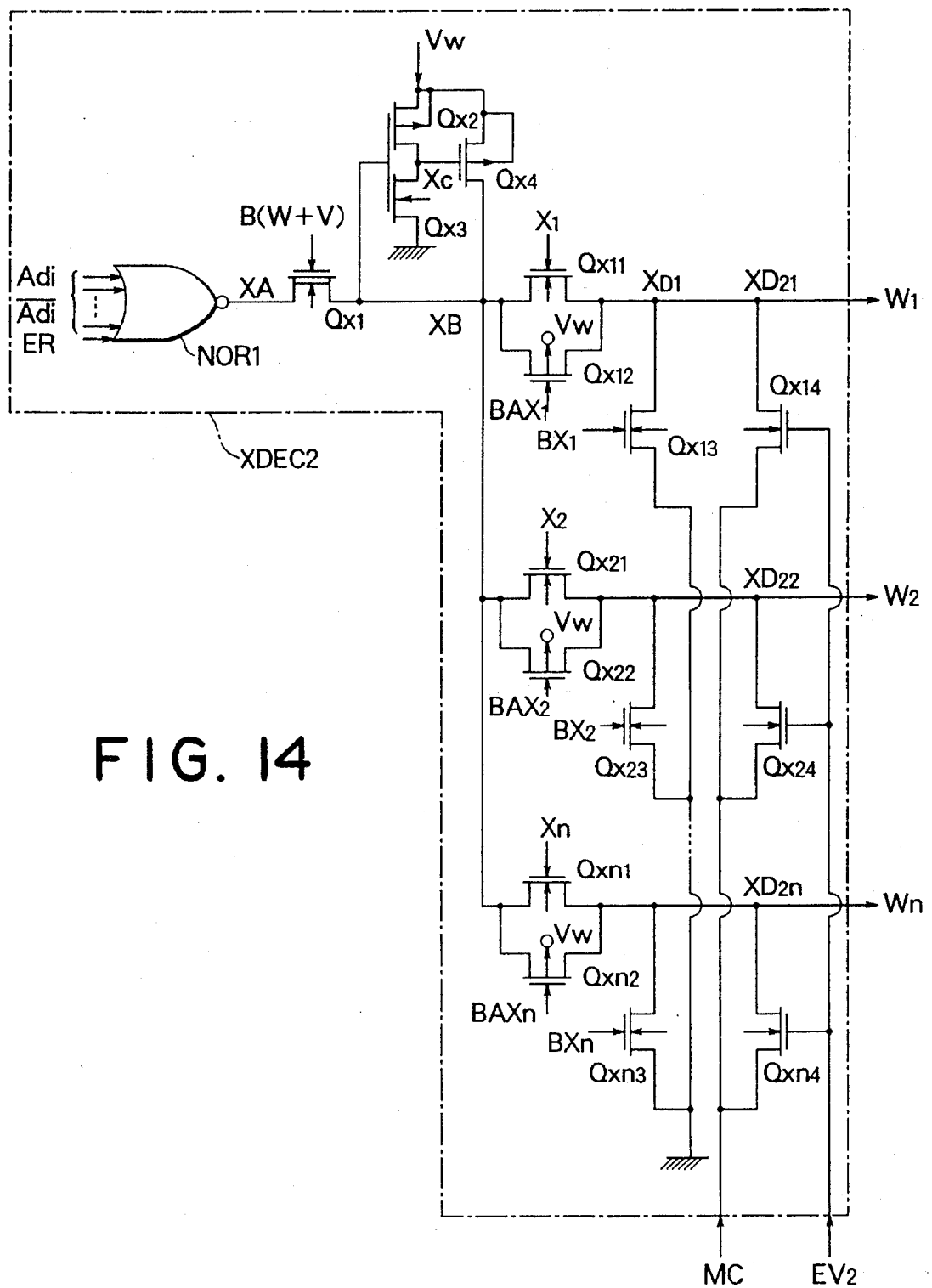
FIG. 14 is a circuit diagram showing the structure of an X decoder according to a second embodiment of this invention.

FIG. 14 illustrates an X decoder according to the second embodiment of the present invention. This X decoder has the structure in FIG. 2 to which NE-MOSFET's $Q_{X14}$, $Q_{X24}$, ... and $Q_{Xn4}$ are added. The gates of the NE-MOSFET's $Q_{X14}$, $Q_{X24}$, ... and $Q_{Xn4}$ are connected to the signal line $EV_2$, which becomes a high level in erase margin check mode and a low level otherwise. Those MOSFET's $Q_{X14}$, $Q_{X24}$, ... and $Q_{Xn4}$ have their sources applied with the margin check voltage $V_{MC}$ and their drains respectively connected to X address lines $W_1$–$W_n$.

The operation of this X decoder will be explained below. In erase margin check mode, the voltage settings are $VW=V_{CC}$, $B(W+V)=V_{CC}$, $X_1$ to $X_n=0$ V, $BX_1$ to $BX_n=V_{CC}$, and $BA_{X1}$ to $BA_{Xn}=V_{CC}$. Further, the power supply voltage $V_{CC}$ is applied to the selected Y address line, and 0 V to the non-selected Y address lines.

In erase margin check mode, the margin check voltage $V_{MC}$ is applied to the signal line MC. When a signal on the signal line $EV_2$ changes to a high level from a low level, MOSFET's $Q_{X14}$, $Q_{X24}$, ... and $Q_{Xn4}$ are all turned on, while the MOSFET's $Q_{X11}$, $Q_{X12}$, $Q_{X13}$, $Q_{X21}$, $Q_{X22}$, $Q_{X23}$, ... $Q_{Xn2}$ and $Q_{Xn3}$ are all turned off, causing the voltages of all the X address lines $W_1$, ..., and $W_n$ to become the margin check voltage $V_{MC}$.

It is therefore possible to check if there is a memory cell whose threshold value is lower than the margin check voltage $V_{MC}$ for the individual digit lines.

In short, this embodiment can remove a chip, which is likely to slow the writing speed or disable writing due to the over-erasure of memory cells, as a defect at the stage of checking the functions of the chip (e.g., the inspection at the time of factory shipment). It is thus possible to provide highly reliable flash EEPROM's.

What is claimed is:

1. A non-volatile semiconductor memory device comprising:

a plurality of row address lines;

a plurality of digit lines;

means for sensing and amplifying signals on said digit lines and outputting said amplified signals;

a plurality of memory cells each having a current path with a plurality of terminals, one end of said current path connected to an associated one of said digit lines and having a gate connected to an associated one of said row address lines; and means for discriminating said memory device as a defect by detecting, as an electrically over-erased memory cell, any and all memory cells which will become improperly conductive by parasitic capacitance between a drain of said memory cell and said gate during normal read or write cycles, said discriminating means comprising:

read means for applying a same predetermined voltage, which is a positive voltage less than a power source voltage and substantially equal to a minimum normal operating threshold value of those of said memory cells which are electrically erased, to all of said row address lines to read out stored data from said memory cells.

2. The semiconductor memory device according to claim 1, wherein said read means applies the predetermined voltage to all of said row address lines to detect whether or not there is an electrically erased memory cell whose threshold value is lower than the predetermined voltage, thereby to detect if there is an electrically over-erased memory cell.

3. The semiconductor memory device according to claim 2, wherein each of said plurality of memory cells has a floating gate and a current path, and said predetermined value is a value which can prevent non-selected memory cells from erroneous turn on due to parasitic capacitance between a terminal electrode of the current path and the floating gate of the memory cells.

4. The semiconductor memory device according to claim 1, wherein said read means includes:

selecting means for sequentially selecting said digit lines; and means for applying the predetermined voltage to control gates of said memory cells commonly connected to the digit line which is selected by said selecting means to read out stored data from said memory cell, and detecting whether or not there is an electrically erased memory cell whose threshold value is lower than the predetermined voltage in order to detect if there is an electrically over-erased memory cell.

5. The semiconductor memory device according to claim 1, wherein said read means includes:

selecting means for selecting a digit line; and means for applying said predetermined voltage to control gates of said memory cells commonly connected to said selected digit line to detect if a voltage on said selected digit line drops.

6. The semiconductor memory device according to claim 1, wherein said read means includes:

generating means for outputting the predetermined voltage; and means, connected to said row address lines, for applying a read voltage to a selected row address line in read mode, applying a write voltage to a selected row address line in write mode, and applying said predetermined voltage, supplied from said generating means, to all of said plurality of row address lines to detect if there is any electrically over-erased memory cell, when said means receives an address code defining the row address line to be selected and said predetermined voltage.

7. The semiconductor memory device according to claim 1, further comprising erasing means for electrically erasing said plurality of memory cells, after electric erasure of said plurality of memory cells by said erasing means is complete, said read means detects whether or not there is an electrically erased memory cell whose threshold value is lower than said predetermined voltage in order to detect if there is an electrically over-erased memory cell.

8. The semiconductor memory device according to claim 7, wherein said erasing means includes means for repeating electric erasure of all of said plurality of memory cells until all the threshold values of said plurality of memory cells become equal to or smaller than a given value.

9. A non-volatile semiconductor memory device comprising:

a plurality of memory cells each for storing data by a change in a threshold value;

write means, connected to said plurality of memory cells, for writing predetermined data in a selected memory cell by setting the threshold value of said selected memory cell higher than a predetermined value;

erasing means, connected to said plurality of memory cells, for electrically erasing said plurality of memory cells; and means for discriminating said memory device as a defect by detecting, as an electrically over-erased memory cell, any and all memory cells which will become improperly conductive by parasitic capacitance between a drain of said memory cell and said gate during normal read or write cycles, said discriminating means comprising:

checking means, connected to said plurality of memory cells, for checking if the threshold values of those memory cells electrically erased by said erasing means are equal to or greater than a predetermined reference value which is a positive voltage less than a power source voltage and substantially equal to a minimum normal operating threshold value of those of said memory cells which are electrically erased.

10. The semiconductor memory device according to claim 9, wherein said checking means detects whether or not there is an electrically erased memory cell whose threshold value is lower than the reference value in order to detect if there is an electrically over-erased memory cell.

11. The semiconductor memory device according to claim 10, wherein each of said plurality of memory cells has a floating gate and a current path, and said predetermined value is a value which can prevent non-selected memory cells from erroneous turn on due to parasitic capacitance between a terminal of the current path and the floating gate of the memory cells.

12. The semiconductor memory device according to claim 9, wherein said checking means applies a voltage equal to the predetermined reference value to gates of said plurality of memory cells to check if there is a memory cell which is turned on in order to detect if there is an electrically over-erased memory cell.

13. The semiconductor memory device according to claim 9, wherein said erasing means includes means for repeating electric erasure of all of said plurality of memory cells until all the threshold values of said plurality of memory cells become equal to or smaller than a given value.

14. A memory cell checking method comprising:

an erasing step of electrically erasing a plurality of memory cells of a memory chip;

a checking step of checking if threshold values of said memory cells are equal to or above a reference value to detect an electrically over-erased memory cell, said checking step being performed after completion of said erasing step; and a step of discriminating said memory chip as a defect when a memory cell whose threshold value is below said reference value, which is a positive voltage less than a power source voltage and substantially equal to a minimum normal operating threshold value of those of said memory cells which are electrically erased, is detected in said checking step.

15. The memory cell checking method device according to claim 14, wherein each of said plurality of memory cells has a floating gate and a current path, and the reference value is a value which can prevent non-selected memory cells from erroneous turn on due to parasitic capacitance between a terminal of the current path and the floating gate of the memory cells.

16. A memory cell checking method comprising:

a writing step for writing data in a plurality of memory cells to be electrically erased, to set a threshold value of each of said memory cells equal to or greater than a predetermined value, said plurality of memory cells being included in a memory chip and storing data by changing the threshold values;

an erasing step of electrically erasing said plurality of memory cells to be erased to which data are electrically written by said writing step;

an erase verify step for checking the threshold values of said electrically erased memory cells and repeating said erasing step until the threshold value of all of said plurality of memory cells to be erased become equal to or below a first positive value;

a checking step to be performed after detecting that said threshold value of all of said plurality of memory cells to be erased have become equal to or below said first positive value, to check if the threshold values of said plurality of memory cells are equal to or above a second positive value substantially equal to a minimum normal operating threshold value of those of said memory cells which are electrically erased and smaller than the first positive value to detect an electrically over-erased memory cell; and a step of discriminating said memory chip as a defect when a memory cell whose threshold value is below said second positive value is detected as electrically over-erased in said checking step.

17. The memory cell checking method device according to claim 16, wherein each of said plurality of memory cells has a floating gate and a current path, and the reference value is a value which can prevent non-selected memory cells from erroneous turn on due to parasitic capacitance between a terminal of the current path and the floating gate of the memory cells.

18. A memory cell checking method comprising the steps of:

providing an electrically erasable and programmable non-volatile semiconductor memory device which includes a plurality of MOS transistor memory cells each having a source, a drain, a control gate and a floating gate, the control gate of each of said MOS transistor memory cells being connected to an associated one of address lines and the drain of each of said MOS transistor memory cells being connected in common to a digit line, one of said MOS transistor memory cells being in a data-write operation supplied with a set of writing voltages through an associated one of said address lines and said digit line while applying a first voltage to the control gate of each of remaining ones of said MOS transistor memory cells through remaining ones of said address lines, said one of said MOS transistor memory cells being thereby changed to have a first threshold value higher than a predetermined threshold value, and each of said remaining ones of said MOS transistor memory cells thereby receiving a second voltage at the floating gate thereof due to capacitance-coupling between the drain and the floating gate, said second voltage being higher than said first voltage;

writing a data into each of said MOS transistor memory cells by supplying said set of writing voltages thereto, each of said MOS transistor memory cells being thereby changed to have said first threshold value;

performing an erasing-verifying operation in which each of said MOS transistor memory cells is applied with a set of erasing voltages, simultaneously, for a predetermined time period, and each of said MOS transistor memory cells is then supplied with a set of verifying voltages to check if all said MOS transistor memory cells have a second threshold value smaller than said predetermined threshold value, said erasing-verifying operation being repeated until all the MOS transistor memory cells have said second threshold value; and supplying a third voltage that is substantially equal to said second voltage to the control gate of each of said MOS transistor memory cells through an associated one of said address line to thereby check if said MOS transistor memory cell is made conductive by said third voltage.

* * * * *

UNITED STATES PATENT AND TRADEMARK OFFICE
CERTIFICATE OF CORRECTION

PATENT NO. : 5,513,193
DATED : April 30, 1996
INVENTOR(S) : Kiyokazu HASHIMOTO

It is certified that error appears in the above-indentified patent and that said Letters Patent is hereby corrected as shown below:

Column 1, line 24, delete "$M_{11}, ..., $ and $M_{1m}$" and insert --$M_{\ell 1}, ..., $ and $M_{\ell m}$--;

line 27, delete "$D_1)$" and insert --$D_\ell)$--;
line 29, delete "to $Q_{y1}$" and insert --$Q_{y\ell}$--;
line 31, delete "to $D_1$" and insert --to $D_\ell$--;
line 32, delete "to $Y_1$" and insert --to $Y_\ell$--;
lines 39 and 40, delete "$M_{1m}, ..., M_{11}, ..., $ and $M_{1m}$" and insert --$M_{\ell m}, ..., M_{\ell 1}, ..., $ and $M_{\ell m}$--.

Column 2, line 55, delete "$Y_1$-$Y_1$" and insert --$Y_1$-$Y_\ell$--.

Column 4, line 18, after " "$Q_{x23}$" " insert -- "$Q_{xn1}$" --.

Column 8, line 46, delete "$Q_m6$" and insert --$Q_{m6}$--.

UNITED STATES PATENT AND TRADEMARK OFFICE
CERTIFICATE OF CORRECTION

PATENT NO. : 5,513,193
DATED : April 30, 1996
INVENTOR(S) : Kiyokazu HASHIMOTO

It is certified that error appears in the above-indentified patent and that said Letters Patent is hereby corrected as shown below:

Column 10, line 8, delete "$M_{1m}$" and insert --$M_{\ell m}$--;
             line 18, delete "$Q_{y1}$" and insert --$Q_{y\ell}$--;
             line 49, delete "$Q_{y1}$" and insert --$Q_{y\ell}$--;
             line 50 delete "$D_1$-$D_1$" and insert --$D_1$-$D_\ell$--.

Column 11, line 28, after "$Q_{x23}$, ..." insert --$Q_{xn1}$,--.

Signed and Sealed this

First Day of October, 1996

*Attest:*

BRUCE LEHMAN

*Attesting Officer*     *Commissioner of Patents and Trademarks*